United States Patent [19]

Amelio et al.

[11] 4,024,512

[45] May 17, 1977

[54] LINE-ADDRESSABLE RANDOM-ACCESS MEMORY

[75] Inventors: Gilbert F. Amelio, Saratoga; Kamleshwar C. Gunsagar, Campbell, both of Calif.

[73] Assignee: Fairchild Camera and Instrument Corporation, Mountain View, Calif.

[22] Filed: June 16, 1975

[21] Appl. No.: 587,441

[52] U.S. Cl. .................... 340/173 RC; 340/173 DR
[51] Int. Cl.² .................. G11C 21/00; G11C 7/00; G11C 19/28
[58] Field of Search ............. 340/173 DR, 173 RC, 340/173 R

[56] References Cited
UNITED STATES PATENTS

| | | | |
|---|---|---|---|
| 3,859,640 | 1/1975 | Eberlein et al. | 340/173 RC |
| 3,889,245 | 6/1975 | Gosney | 340/173 R |

OTHER PUBLICATIONS

Kosonocky, Two–Phase Charge–Coupled Devices, RCA Technical Notes, TH No. 931, Apr. 26, 1973.

Amelio, Charge–Coupled Devices, Scientific American, vol. 230, No. 2, Feb. 1974, pp. 23–31.

*Primary Examiner*—Stuart N. Hecker
*Attorney, Agent, or Firm*—Alan H. MacPherson; Henry K. Woodward; Norman E. Reitz

[57] ABSTRACT

A line-addressable random-access memory (LARAM) comprises a plurality of lines of charge storage elements, means for introducing charge representing binary information to the beginning of particular ones of the plurality of lines of charge storage elements which are addressed, at least one data clock signal means for effecting the transfer of charge along those lines of the charge storage elements which are addressed, an address-selection matrix electrically coupled between the clock signal means and the lines to permit the addressed ones of the lines to be clocked, and charge-sensor means for receiving charge from the addressed lines and, in response thereto, generating a signal which represents the data signified by the charge and for recirculating a refreshed representation of the charge to the means for introducing charge.

8 Claims, 22 Drawing Figures

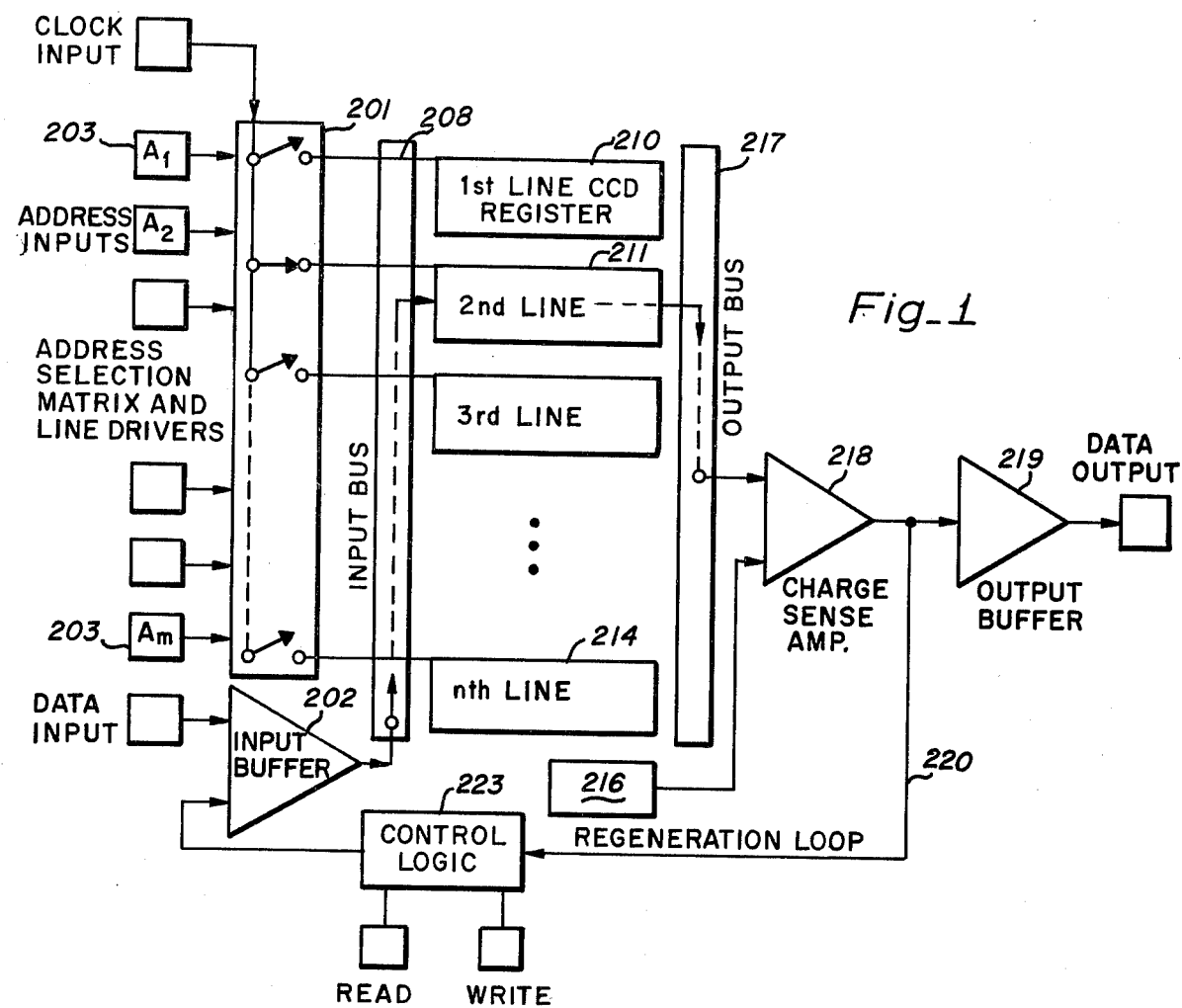
Fig_1
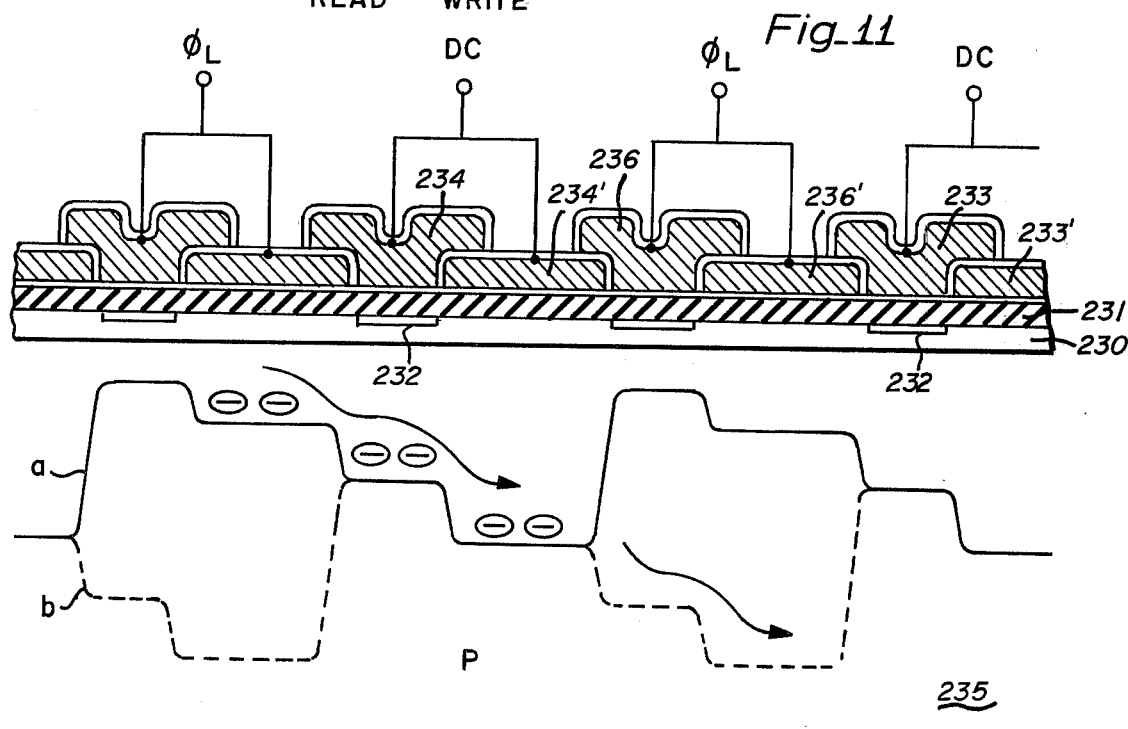
Fig_11

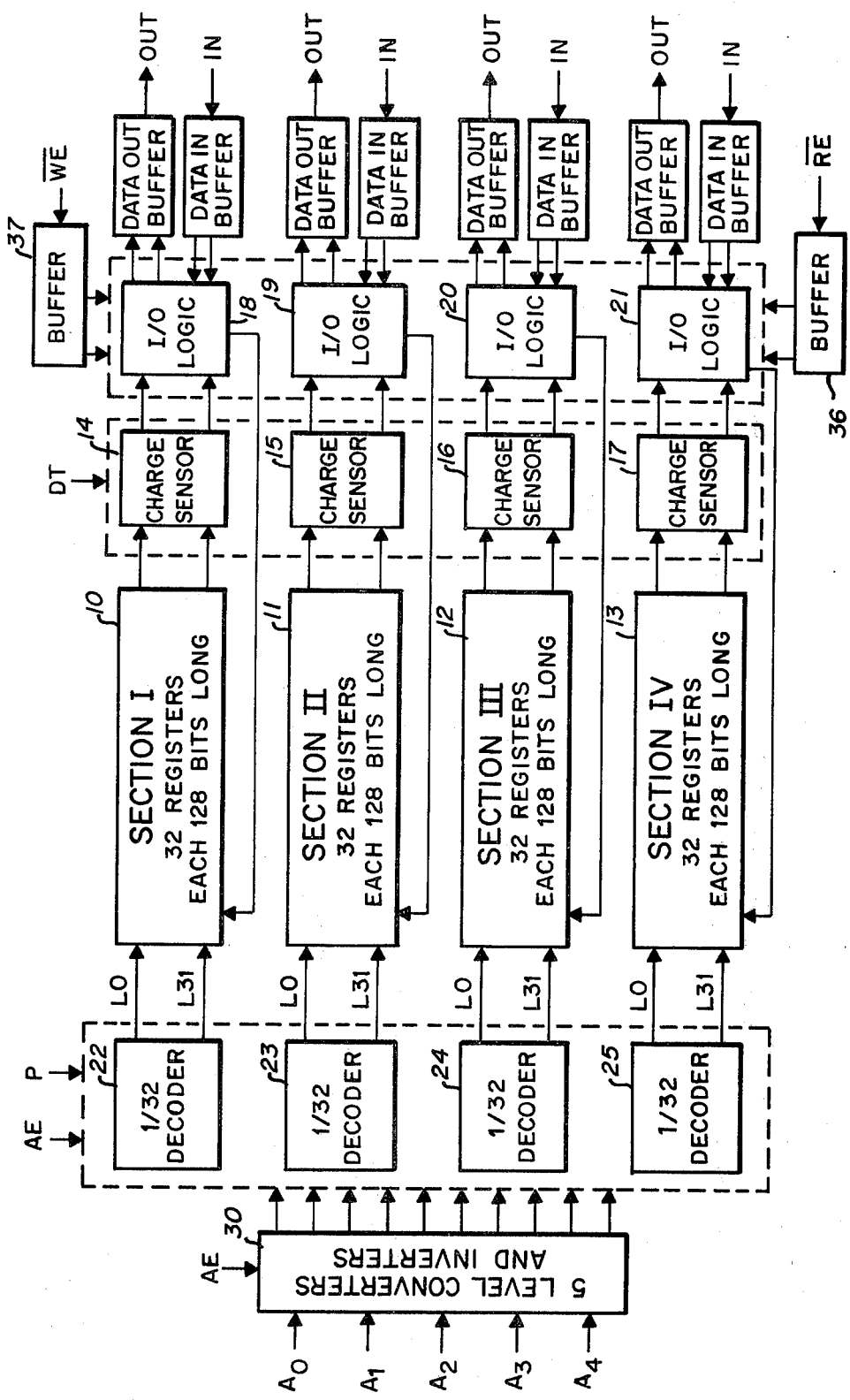
Fig._2

ADDRESS LEVEL CONVERTER AND INVERTER

LINE DRIVER AND DECODER

INPUT CIRCUIT

WRITE ENABLE

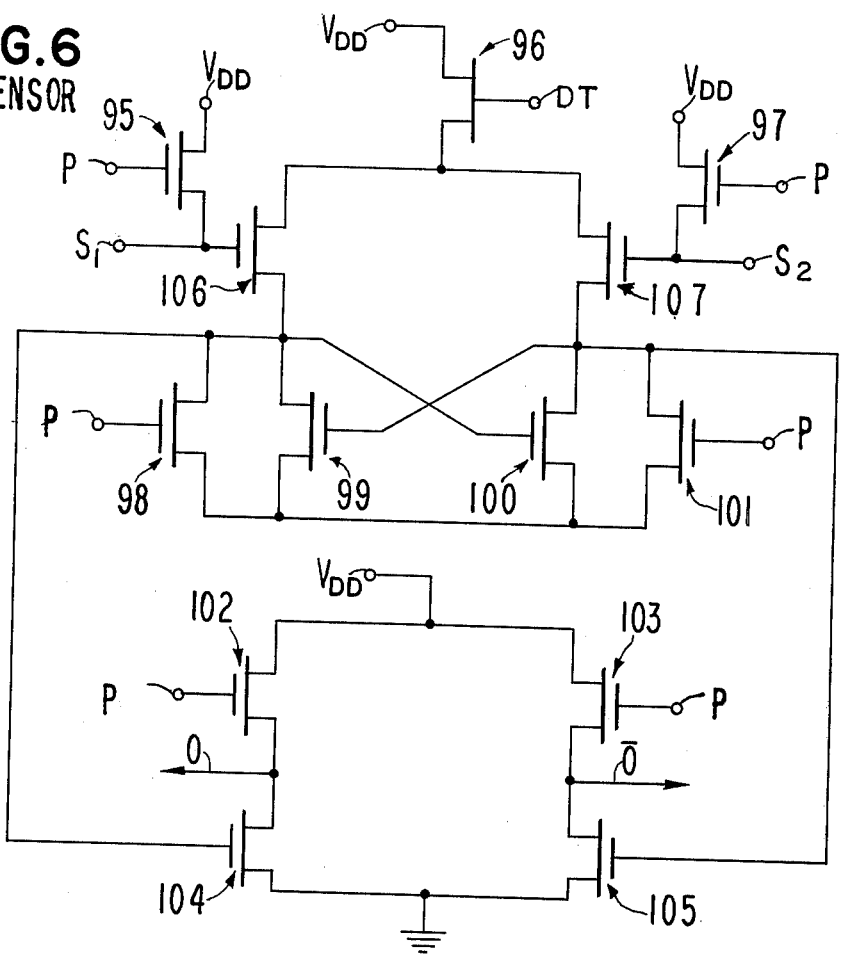
FIG.6 CHARGE SENSOR
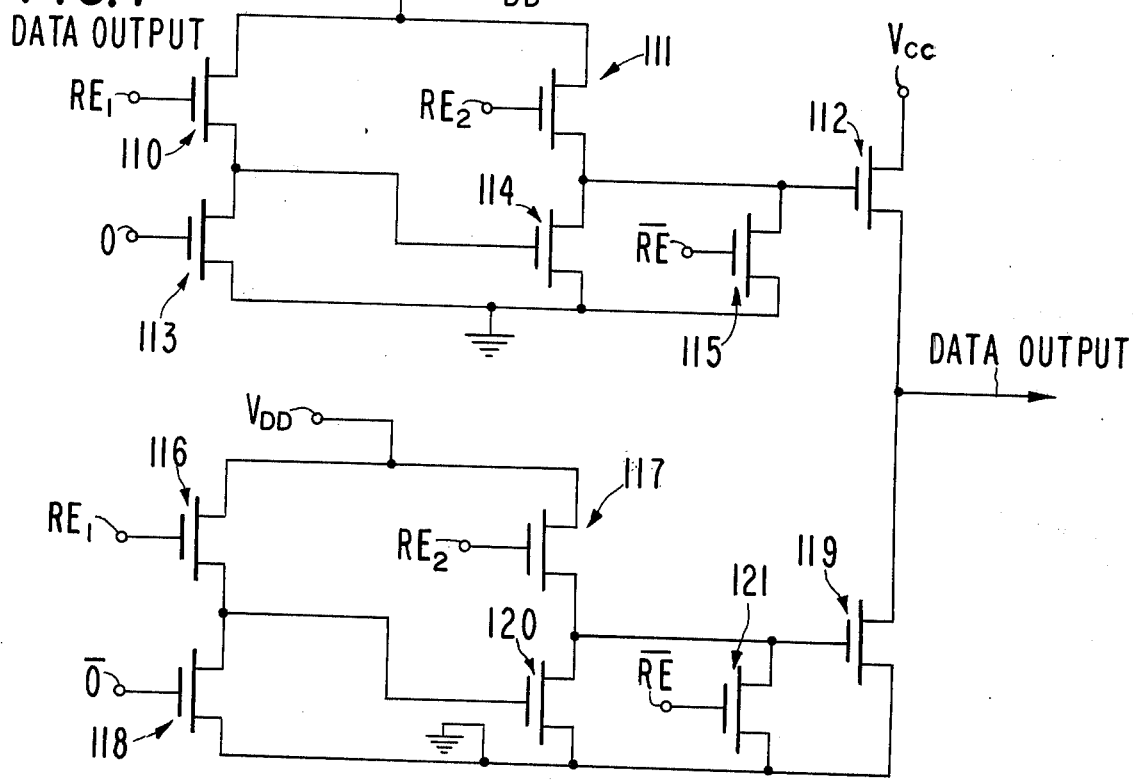
FIG.7 DATA OUTPUT

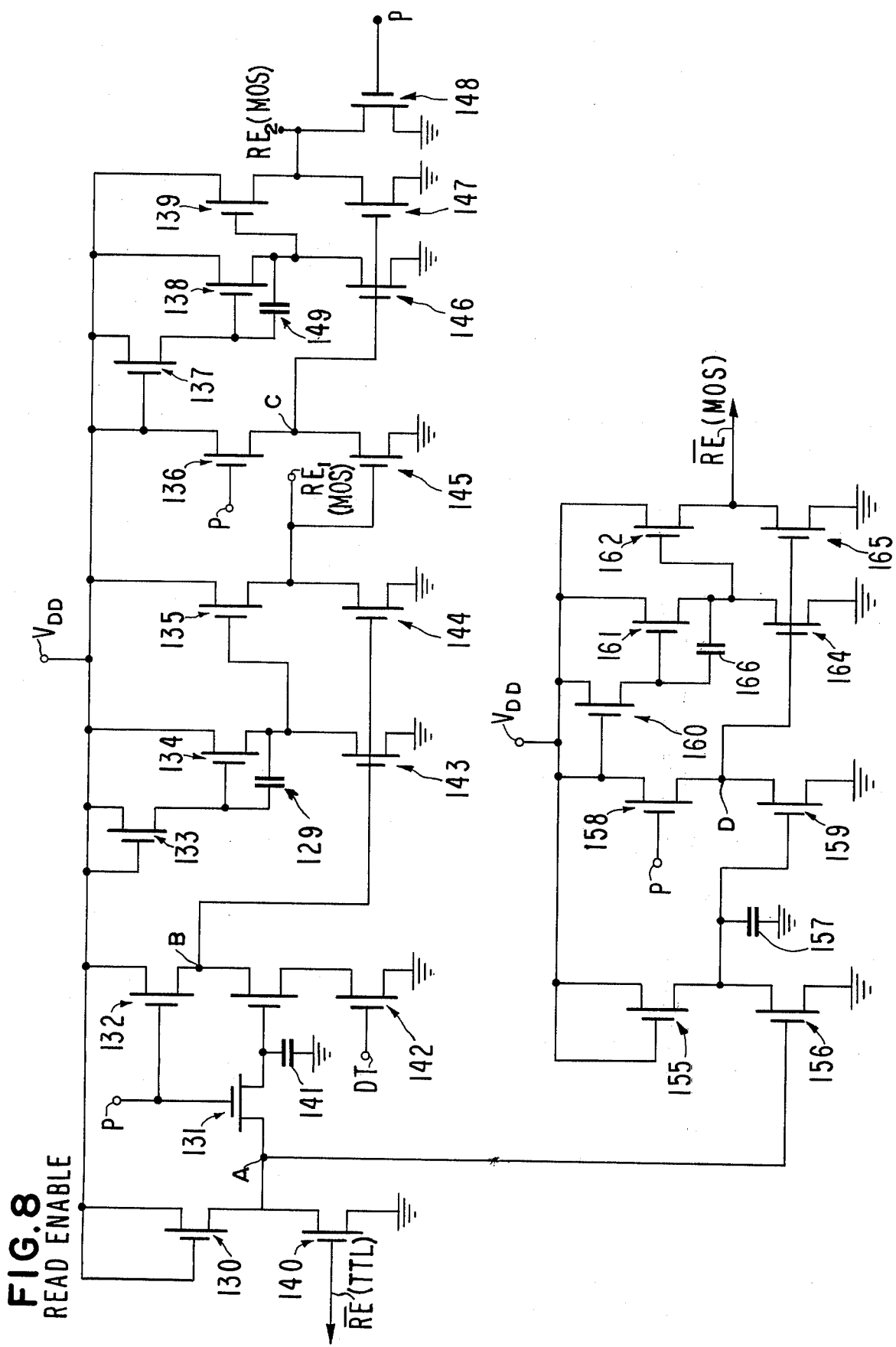
FIG. 8 READ ENABLE

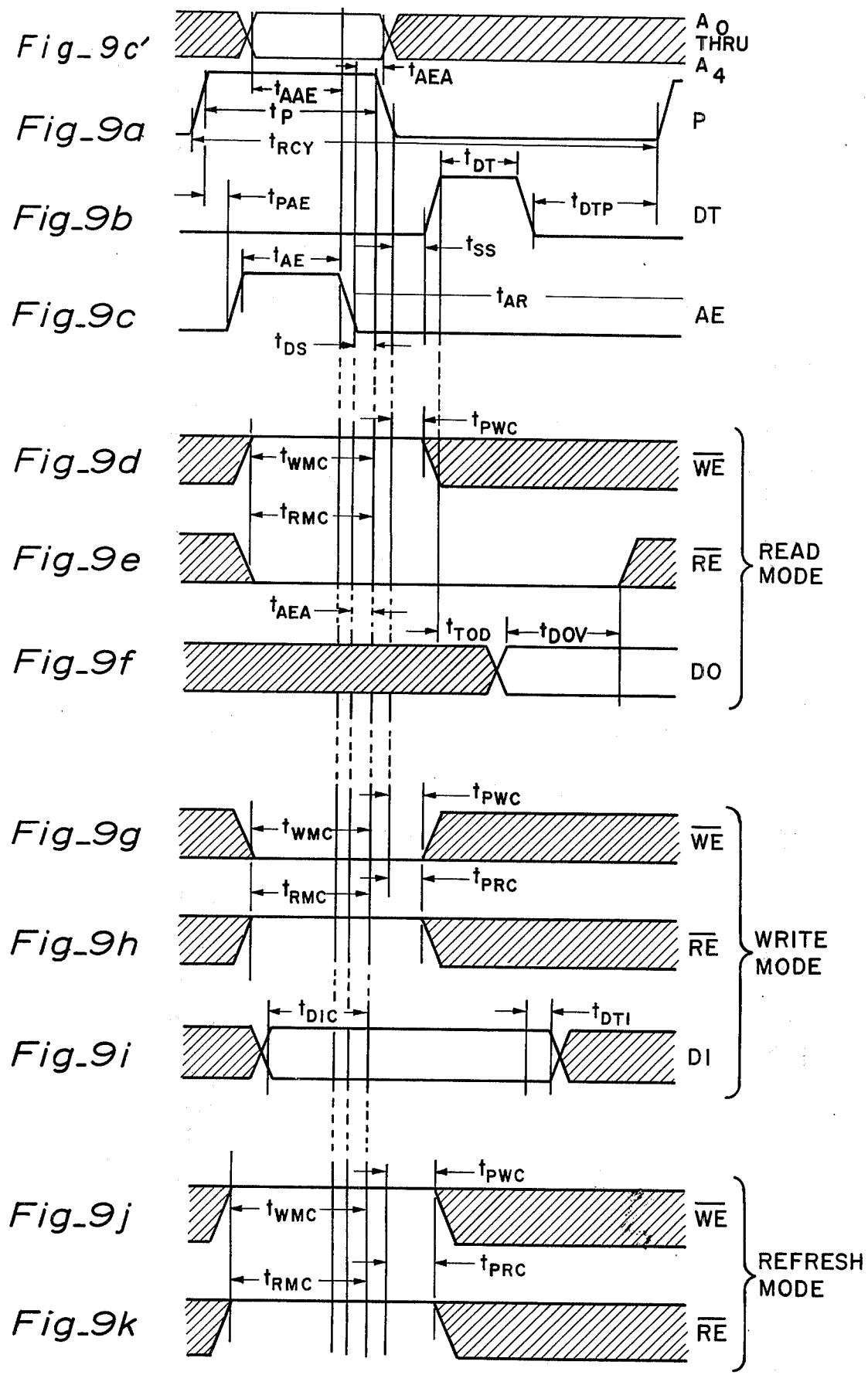

LINE-ADDRESSABLE RANDOM-ACCESS MEMORY

BACKGROUND OF THE INVENTION

This invention relates to a charge-coupled memory and, more particularly, relates to a charge-coupled line-addressable random-access memory (LARAM) which incorporates a uniphase clocking system.

The development of charge-coupled devices (CCD's) as described in the article by Gilbert F. Amelio, "Charge-Coupled Devices," *Scientific American*, Feb. 1974, Vol. 230, No. 2, p. 23, has made possible the fabrication of long shift registers having stages consisting of individual charge storage elements. These shift registers may be used in an interleaved format as in area-imaging devices or may be incorporated in analog delay lines. When strings of charge-coupled elements are organized in parallel format with associated addressing and date read-out circuitry, they become potentially suitable for use as random-access memories. This is true even though inherently such a collection of parallel shift registers does not allow random access to every bit in every register since the data in a given register must be circulated through a complete cycle to permit access to every bit. However, the circulation can be conducted at frequencies on the order of 5 to 10 MHz so the actual access time will be dependent only on line length and on clock frequency and will be on the order of microseconds, and access, as a practical matter, can be considered to be essentially random. Recirculating serial memories organized in parallel format have been reported to have, for example, 4096 bits of memory organized in 16 tracks of 256 bits each. See S. R. Rosenbaum and J. T. Caves, "CCD Memory Arrays with Fast Access by On-Chip Decoding," 1974 *ISSCC Digest*, pp. 210–211. The data continuously circulates in each track with the requirement that power be continuously supplied and with the result that the input/output circuitry must interact with a high capacitance since it has access to all lines at all times.

Charge-coupled shift registers may be designed with various clocking schemes. The most common and straight-forward schemes are four-phase, three-phase or two-phase schemes in which, respectively, every fourth, third or second electrode is tied to the same clock signal. The simplest scheme utilizes a single clock and is commonly denoted uniphase clocking. In this scheme, every second electrode is tied to the single clock while the alternating electrodes are held at a d.c. potential which lies inbetween the high and low extremes of the dynamic clock. In general, the simpler the clocking scheme, the higher the yield in fabricating the device and the more efficient the device in actual operation.

SUMMARY OF THE INVENTION

A line-addressable random-access memory (LARAM) comprises a plurality of lines of charge storage elements, means for introducing charge representing binary information to the beginning of particular ones of the plurality of lines of charge storage elements which are addressed, at least one data clock signal means for effecting the transfer of charge along those lines of the charge storage elements which are addressed, an address-selection matrix electrically coupled between the clock signal generator and the lines to permit the addressed ones of the lines to be clocked, and charge-sensor means for receiving charge from the addressed lines and, in response thereto, generating a signal which represents the data signified by the charge and for recirculating a refreshed representation of the charge to the means for introducing charge.

In one embodiment the LARAM is organized with four sections of 32 lines. A five-bit address may be used to impose the clock waveform on one line in each section. Thus, a four-bit byte can be written, read or refreshed. Each section has its own associated address decoder, charge sensor and I/O logic. Address enable, inverse read enable, inverse write enable and clocks are common to all sections.

BRIEF DESCRIPTION OF THE DRAWINGS

For a more complete understanding of the line-addressable random-access memory of the present invention, reference may be had to the drawings which are incorporated herein by reference and in which:

FIG. 1 is a block diagram of a generalized LARAM organization;

FIG. 2 is a block diagram of a 16,384-bit LARAM organized in four groups, each group having 32 lines with 128 bits/line;

FIG. 6 is a circuit schematic for a particular sensor refresh circuit for the LARAM of FIG. 2;

FIG. 7 is a circuit schematic for a particular data output circuit for the LARAM of FIG. 2;

FIG. 8 is a circuit schematic for a particular read enable circuit for the LARAM of FIG. 2;

FIGS. 9a–9k are a series of timing diagrams for the operation of the LARAM of FIG. 2 with:

FIG. 9a illustrating the master clock;

FIG. 9b illustrating the data transmission clock;

FIG. 9c illustrating the address enable clock;

FIG. 9c' illustrating the address validity check time interval;

FIGS. 9d–9f illustrating the inverse write enable, inverse read enable and data output pulses for the Read Mode;

FIGS. 9g–9i illustrating the inverse write enable, inverse read enable and data input pulses for the Write Mode;

FIGS. 9j–9k illustrating the inverse write enable and inverse read enable for the Refresh Mode;

FIG. 11 is a pictorial side view of a portion of a uniphase line of charge-coupled elements with the solid potential line showing data storage under the dynamic electrode and the dotted potential line showing data storage under the static electrode.

LARAM Organization

Figure 10:
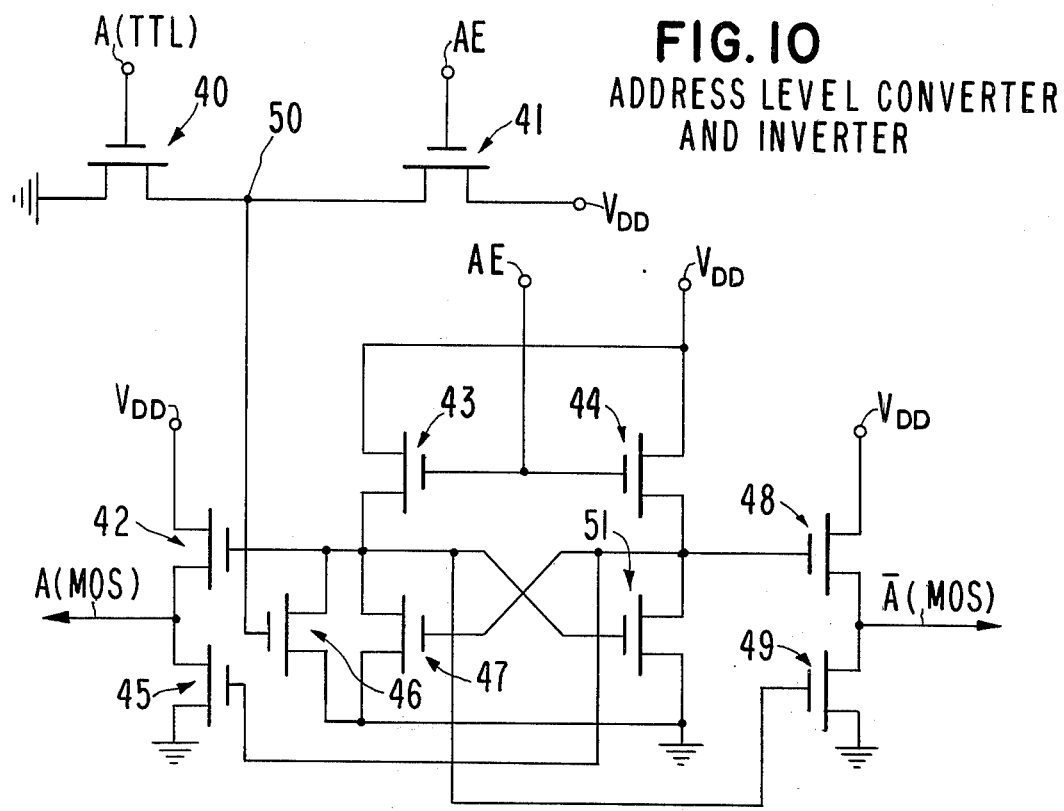
FIG. 10 is a circuit schematic for a particular address level converter and inverter for the LARAM of FIG. 2.

A generalized LARAM organization is shown in FIG. 1. It comprises a self-contained memory system with a common input bus 208 and a common output bus 217, coupled with a series of $n$ charge-coupled lines 210, . . . . 214. A clock input to any one line is coupled through a corresponding one of a plurality of line drivers (formed as part of address-selection matrix and line drivers 201), thereby to impose an input clock waveform on whichever line is addressed by the address-selection matrix 201. Unaddressed lines are maintained in a definite state. During a write cycle, a clock would be imposed on line 211 (shown to be addressed) and data would be inputted through input buffer 202 to the beginning of line 211. During a read cycle the data on addressed line 211 is dumped onto output bus 217, then is introduced to charge sense amplifier 218 and thereafter is transmitted through output buffer 219 to a data output terminal; also, the data is passed via regeneration loop 220 back to input bus 208 and into the addressed line. During a refresh cycle, data on an addressed line passes through control logic 223 via regeneration loop 220 to be reintroduced through input buffer 202 to the addressed line.

In operation, each line is like an independent storage register which shares input and output circuitry with the other lines. Such an electronic scheme has extremely low capacitive requirements on the clocks since the external clocks are buffered by line drivers (part of address-selection matrix and line drivers 201). Support circuitry is simplified because n lines share a common input bus and a common output bus; for example, a single charge sense amplifier will suffice for n lines. Since the n lines are independent, any one line can be halted and another line accessed without restoring the first line to its initial position. Furthermore, chip power dissipation is low since only one data line is clocked at a time.

The organization of a LARAM is like a random-access memory (RAM) except that lines of charge-coupled elements are accessible rather than individual bits. Although access is not perfectly random, the worse-case latency time is very short since the clock rate is on the order of MHz and the number of bits per line is on the order of 100. A particularized organization of such a memory system can be by bits or words, depending on whether the lines are coequal or are lumped together in groups. A suitable convention to describe organzation is to let M be the number of bits in a line and N be the total number of lines accessed by an address-selection matrix. The number of logic lines or address bits $n$ required to establish a unique address for each line will be $\log_2 N$; for example, if $N = 64$, $n = 6$. For a word-organized LARAM, groups of lines may be employed with each group having an address-selection matrix and associated sense, refresh and output circuitry. Basic system logic such as address enable, read enable, write enable and clocks such as data transmission and pre-charge can be generated by circuitry common to all groups.

DESCRIPTION OF THE PREFERRED EMBODIMENT

In the description of the preferred embodiment herein, certain conventions are employed. The logic operations are performed in the binary system so that the voltage level on a given line will be stated to be "high" or "low," corresponding with the two logic states associated, respectively, with a higher and lower range of voltage levels. Similarly, the data is stored and transmitted in binary format so that a charge packet with a magnitude greater than a given reference charge will represent a digital 1, while a charge packet with a magnitude less than a given reference charge will represent a digital 0. The reverse may also be employed. In this description, therefore, when read enable or any other system logic level is high, lines connected to read enable or to the other logic level lie at a voltage within a range which signifies that the read enable or the other logic function is to be performed.

The preferred embodiment of FIG. 2 is a word-organized (4 bits/word) 16,384-bit LARAM. This embodiment is organized with four sections 10, 11, 12 and 13, each of which has 32 lines ($N=32$) of charge-coupled elements with 128 ($M=128$) elements per line. This organization permits a 4-bit word to be processed with a particular 4-bit word having one bit stored in a particular line of each section. A particular line in each section may be addressed by a 5-bit address, consisting of bits $A_0, \ldots A_4$, which are introduced to level converter and inverter 30. The 5-bit address is decoded by 1/32 decoders 22, 23, 24 and 25 which each select one line from the respective associated section 10, 11, 12 or 13. Thus, when a word is to be read out, the inverse read enable $\overline{RE}$ goes low so that associated buffer 36 activates Input/Output logic modules 18, 19, 20 and 21 to receive data from the associated charge sensors 14, 15, 16 and 17 and to transmit it to the associated output buffer. At the same time, since a read function is being performed and the data must be retained, it is recirculated to the addressed line of the appropriate section. The data has been refreshed as it passed through charge sensors 14, 17 and through Input/Output logic modules 18, ... 21 so that the recirculated data which reposes in shift registers 10, ... 13 after refresh consists of charge packets safely within the range of charge magnitude to appropriately represent the original data. Writing of data is performed in a similar manner by introducing data through the input portions of Input/Output modules 18, ... 21 and then transmitting the data to the beginning of the particular lines which are simultaneously addressed by the five address bits $A_0$, ... $A_4$. For this operation, inverse write enable $\overline{WE}$ goes low and associated buffer 37 causes the input portions of Input/Output logic modules 18, ... 21 to function. In the Write mode, no refreshed data is transmitted in end-around fashion to the input of the lines. In the Refresh mode, $\overline{RE}$ and $\overline{WE}$ go high so that data is refreshed and recirculated while the Input/Output logic modules inhibit a reading or writing function. The introduction of data in the form of charge packets may be accomplished as described in the copending application of Gunsagar, et al., Ser. No. 492,650, assigned to the same assignee as this application. A detailed discussion of the various operating modes of the LARAM of FIG. 2 is found in the discussion of timing diagrams of FIGS. 9a–9k in conjunction with the discussions of FIGS. 3–8 and 10.

FIG. 9a and FIG. 9b show the time relationship between the master clock P and the data transfer clock DT for proper operation of the LARAM of FIG. 2. Altough DT is an external clock signal in the specific embodiment described herein, it can easily be generated on chip from the master clock P, and, in fact, this is a more desirable approach since it ensures proper tracking of the necessary delays with process variations.

The pulse address enable (AE) of FIG. 9c is a logic signal which occurs every time there is an address change. It could, however, occur every cycle without any significant impact on device performance, except for the fact that such operation would result in an increase in power dissipation. Thus, besides serving as a gating pulse to restore internally the last address information present during AE high, it serves as a useful contrivance to save power. The address information is required to be valid for a definite period of time before the pulse AE makes its high-to-low transition, as indicated by the timing diagram of FIG. 9c'. For the proper operation of the decoding scheme employed in this specific embodiment, the master clock P has to overlap AE at both its leading and trailing edges, as indicated by the time intervals $t_{PAE}$ and $t_{DS}$ respectively.

The mode of operation is determined by the logic states of inverse write enable ($\overline{WE}$) and inverse read enable ($\overline{RE}$) signals as captured during the P high state. For example, referring now to FIGS. 9g and 9h, to be in the Write mode, $\overline{WE}$ is required to be low for the time interval $t_{WMC}$ before P falls, while $\overline{RE}$ is required to be high for the time interval $t_{RMC}$, also before P falls. Similar time constraints exist on $\overline{RE}$ and $\overline{WE}$ for other modes of operation.

In the Write mode, the input data (DI) shown in FIG. 9i is valid for the time interval $t_{DIC}$ prior to P falling and stays valid for time interval $t_{DTI}$ after DT falls.

In the Read mode, Output (DO) is valid after a time delay $t_{TOD}$ from the rise of DT and stays valid until $\overline{RE}$ changes state indicating completion of the Read mode, or until the next valid output appears, provided the memory is in a continuous Read mode.

The specification of an address for the LARAM of FIG. 2 is accomplished by means of a 5-bit address whose bits are denominated $A_0, \ldots A_4$ and are introduced to level converter and inverter 30. The address bits in this embodiment will originally be at external logic, e.g., TTL levels. The address will be converted to internal or MOS chip levels in level converter and inverter 30. A particular circuit for address level converter and inverter 30 is shown in FIG. 10. The circuit functions to convert each address input A(TTL) to A(MOS) and its complement $\overline{A}$(MOS). The address enable signal AE effectively strobes the circuit to produce an A(MOS) and a $\overline{A}$(MOS) which reflects the instantaneous level of A(TTL). A(MOS) and $\overline{A}$(MOS) stay valid until the next strobe by AE. In operation, when AE goes high, transistor 41 will be turned on and if the external address bit A(TTL) is low, transistor 40 will be off and no current will flow from $V_{DD}$ to ground. As a result, junction 50 will be retained at a high potential approximately equal to $V_{DD}$. Since transistors 43 and 44 are tied to AE, they are also tuned on. In this case, transistor 46 will be conducting and current will flow from $V_{DD}$ through transistors 43 and 46 to ground. As a result, the gate of transistor 47 is maintained at a relatively high potential as compared to the gate of transistor 51. Thus, the gate of transistor 42 is low and the gate of transistor 48 is high; also, the gate of transistor 45 is high and the gate of transistor 49 is low. Thus, A(MOS) is low since any charge discharges to ground through transistor 45 whereas $\overline{A}$(MOS) is high since current is supplied from $V_{DD}$ through transistor 48 and is not discharge to ground through transistor 49. The reverse A(MOS) levels are obtained if A(TTL) is high and the voltage on junction 50 is low.

Figure 3:
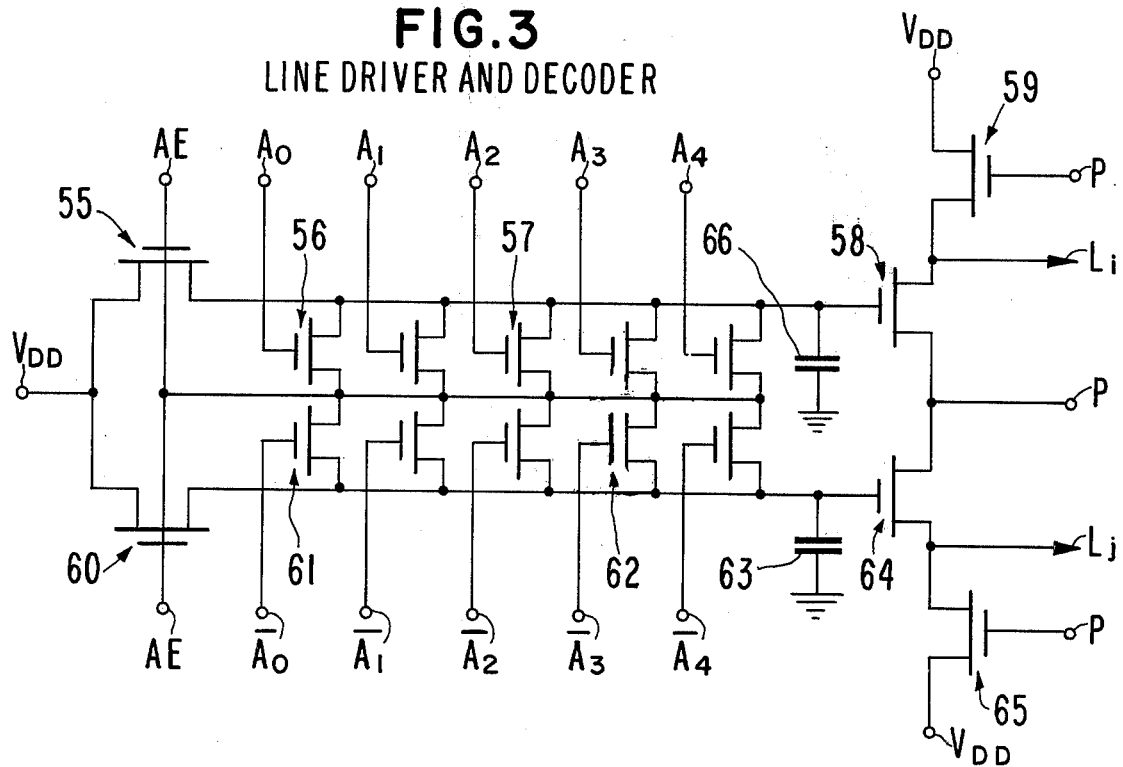
FIG. 3 is a circuit schematic of a particular line driver and decoder for the LARAM of FIG. 2.

With a multiple-bit address it is necessary that each permutation of the address bits specify a particular line, $L_i$, in each section of lines. This is accomplished by a network of decoders which will activate one of 32 lines, depending upon the states of the address bits. The line driver and decoder of FIG. 3 illustrates two individual line decoders which will cause line $L_i$ to be addressed if all of the address bits are zeroes, e.g., if the address is 00000, and will address line $L_j$ if the address is 11111. Any intermediate permutation will result in neither of the lines being addressed; an individual line with a suitable configuration will be addressed. In operation, when AE is high, transistors 55 and 60 are turned on so that capacitors 66 and 63 are charged to $V_{DD}$. When AE goes low the address levels $A_0, \ldots A_4$ and $\overline{A}_0, \ldots \overline{A}_4$ have stabilized. If any one of the transistors such as 56 or 57 are turned on by any of $A_0, \ldots A_4$ being high, then capacitor 66 will discharge to ground. Similarly, if any one of the five transistors such as 61 or 62 are turned on by any of $\overline{A}_0, \ldots \overline{A}_4$ being high, then capacitor 63 will discharge to ground. Thus, capacitor 66 will remain charged only if the address is 00000 while capacitor 63 will remain charged only if the address is 11111. In the former case, transistor 58 will be turned on and a master clock P will be impressed on the addressed line while transistor 64 will be turned off and a high circuit voltage $V_{DD}$ will be maintained on the nonaddressed line. Also some thirty other lines will have a high circuit voltage $V_{DD}$ applied as they, too, will be nonaddressed lines. The reverse situation pertains in the latter case.

Figure 4:
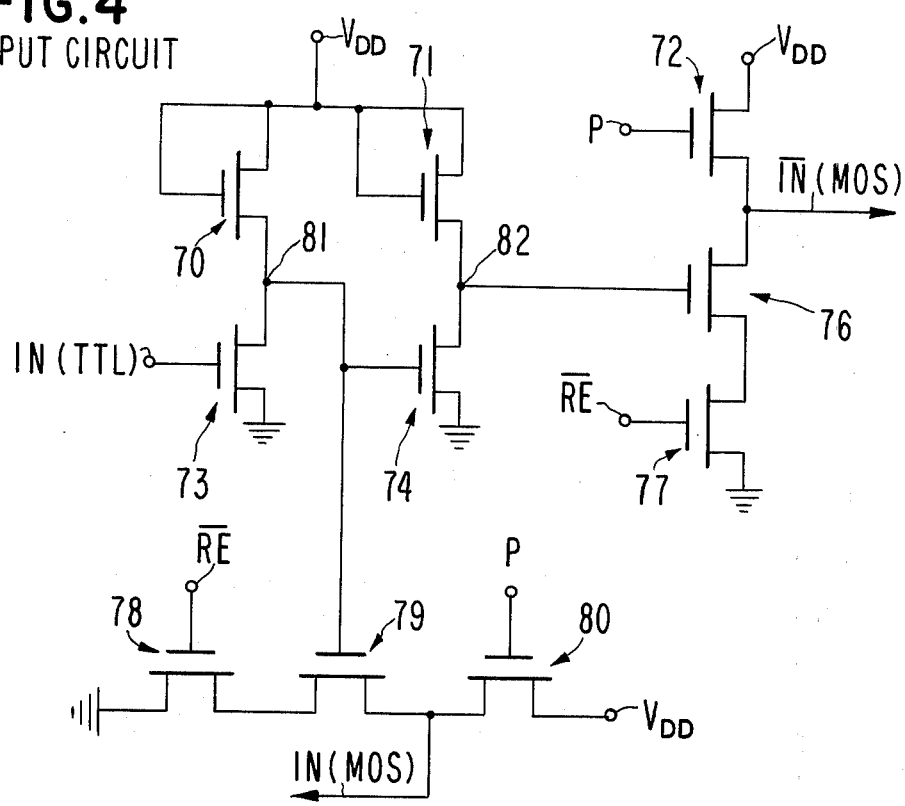
FIG. 4 is a circuit schematic of a particular input circuit for the LARAM of FIG. 2.

The data input is converted from external TTL levels IN(TTL) to internal MOS chip levels IN(MOS) and $\overline{IN}$(MOS) in the Data In buffers in FIG. 2. A particular input circuit is shown in FIG. 4. When P is high, IN(MOS) and $\overline{IN}$(MOS) are unconditionally precharged high to $V_{DD}$ through transistors 80 and 72, respectively. Then, when P goes low, the state of $\overline{IN}$(MOS) and IN(MOS) will be determined in accordance with the switched state of transistors 76 and 79 and the condition of inverse read enable. Since input is permitted only in the write mode, one of the IN(MOS) or $\overline{IN}$(MOS) will stay high while the other will discharge to ground when $\overline{RE}$ goes high. This is possible because when $\overline{RE}$ is high, transistors 78 and 77 are both conducting. If IN(TTL) is high, transistor 73 will be conducting and a current will flow from $V_{DD}$ through transistors 70 and 73 to ground. the voltage on node 81 will be low so that transistor 79 is off. Thus, when $\overline{RE}$ strobes transistor 78, transistor 79 will not conduct, and IN(MOS) remains high. Since node 81 is low, transistor 74 is off and node 82 remains high due to current through transistor 71. Thus, when $\overline{RE}$ strobes transistor 77, transistor 76 will be on and $\overline{IN}$(MOS) will be low. The reverse operation occurs if IN(TTL) is low. As shown in FIG. 2, this circuit is repeated in each Data In buffer.

Figure 5:
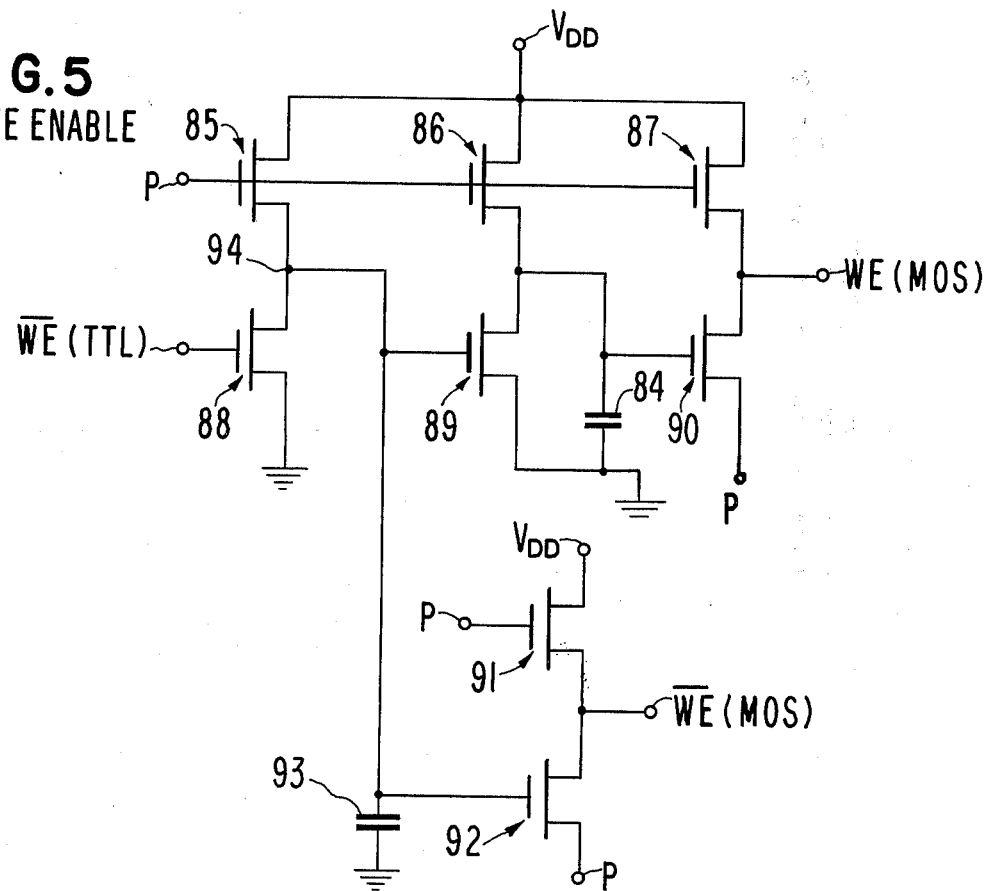
FIG. 5 is a circuit schematic of a particular write enable circuit for the LARAM of FIG. 2.

Similar translations are made for the write enable WE signal and the read enable RE signal as shown in FIGS. 5 and 8. When P is high, WE(MOS) and $\overline{WE}$(MOS) are unconditionally precharged high through transistors 87 and 91, respectively. When P goes low, one of WE(MOS) and $\overline{WE}$(MOS) will remain high and the other will go low depending on the input $\overline{WE}$(TTL). When $\overline{WE}$(TTL) is high, current will flow to ground through transistors 85 and 88 when the precharge clock is high. As a result, junction 94 will be low so that capacitor 93 will not be charged and the gate of transistor 92 will be held low. Thus, transistor 92 will not conduct so that $\overline{WE}$(MOS) remains high. Since transistor 89 is turned off, current will flow through transistor 86 to charge capacitor 84. The charge on capacitor 84 keeps tansistor 90 turned on so that WE(MOS) will be discharged to a low level. The reverse situation will pertain (with capacitor 93 charged and capacitor 84 discharged) for an input of $\overline{WE}$(TTL).

The read enable logic of FIG. 8 is a circuit for buffer 36 of FIG. 2. This circuit converts RE(TTL) to internal signals $\overline{RE}$(MOS), $RE_1$(MOS) and $RE_2$(MOS). These internal signals, in conunction with the particular data output circuit of FIG. 7, permit data to be outputted with low power consumption during the Read mode. RE(TTL) is introduced to the gate of transistor 140, $RE_1$(MOS) is taken from the node common with the source and drain, respectively, of transistors 144 and 135, $RE_2$(MOS) is taken from the node common to transistors 139 and 147. $\overline{RE}$(MOS) is taken from the source of transistor 165. When P is high, $RE_1$(MOS) and $\overline{RE}$(MOS) all become unconditionally low and nodes B and C are precharged high.

If $\overline{RE}$(TTL) is low, transistor 140 is off; then current flows through transistor 130 and charges node A high. Capacitor 141 also becomes charged. When P goes low and DT occurs, transistor 142 turns on and, since capacitor 141 is charged, node B discharges. Thus, transistors 143 and 144 are turned off and the node driving the gate of transistor 135 goes high, causing $RE_1$(MOS) to go high. Capacitor 129 is a bootstrap capacitor which serves to speed up the rise of the node driving transistor 135. Now, since $RE_1$(MOS) is high, transistor 145 is turned on and node C discharges to ground. The low potential on node C turns transistors 146 and 147 off so that $RE_2$ makes the low to high transition in a manner similar to RE. Since node A is high, transistor 156 is on and capacitor 157 does not become charged. Thus, transistor 159 is turned off and node D reposes at a high potential. The high potential on node D keeps transistors 164 and 165 on so that the $\overline{RE}$(MOS) stays low. The respective circuits function essentially in an inverse manner if $\overline{RE}$(TTL) is originally high.

The data output of FIG. 7 is controlled by the read enable voltages $RE_1$(MOS), $RE_2$(MOS) and $\overline{RE}$(MOS) since data is provided as output only in the Read mode. The output O is introduced to the gate of transistor 113 in the top leg of the circuit while the inverse output $\overline{O}$ is introduced to the gate of transistor 118 in the bottom leg of the circuit. Essentially, the data output line tied to the source of transistor 112 and the drain of transistor 119 will be high if output O is high and will be low if the inverse output $\overline{O}$ is high. The gating scheme is employed to reduce power consumption. In operation, if output O is high, transistor 113 will be turned on and a current will flow to ground when $RE_1$(MOS) is high. Thus, the gate of transistor 114 will be low and, when $RE_2$ is high and $\overline{RE}$ is low, the gate of transistor 112 will be high. Transistor 119 will be off because transistor 120 is on and current flows to ground, thereby leaving transistor 119 off. The reverse logic pertains if the inverse output $\overline{O}$ is high, i.e., the data output line will be low.

The charge-sensor modules 14, 15, 16 and 17 (FIG. 2) function to sense the magnitude of the charge packets received from addressed lines within sections 10, 11, 12 and 13. The output of the charge-sensor modules is introduced to the Input/Output modules 18, 19, 20 and 21 to be recirculated through the addressed lines in the Read and Refresh modes and to be gated to the output terminals in the Read mode. The operation of the charge-sensor circuit of FIG. 6 is described in detail in the copending U.S. application of Gunsagar, et al., Ser. No. 448,771, now abandoned, assigned to the same assignee as this application. Briefly, the data charge packet is introduced at $S_1$ at the terminal connected to the gate of transistor 106. A reference charge packet with a magnitude midway between the expected charge representing a digital 1 and the expected charge representing a digital 0 is introduced as $S_2$ at the terminal connected to the gate of transistor 107. This referance charge may have a fixed value but preferably is generated dynamically and tracks the value of the data signal as described in copending patent application of Amelio et al., Ser. No. 492,649, now U.S. Pat. No. 3,955,101. In the LARAM of FIG. 2, it is possible for each group of lines to include a dedicated line of reference charge-coupled elements alongside the addressable lines of data charge storage elements with the charge-storage capacity of the reference elements being one-half that of the data elements. The flip-flop consisting of cross-coupled coupled transistors 99 and 100 will set up in accordance with the relative magnitude of the data charge and the reference charge. The transistor network with transistors 102, 104 103 and 105 functions as a buffer between the signal representing the state of the flip-flop and the Data Output or Input circuitry.

In the preferred embodiment, each of the charge-coupled lines comprises a series of charge-coupled elements clocked in a uniphase manner. A memory cell capable of storing one bit of data consists of the conductive elements 234 and 234' tied to a d.c. voltage (and called the static electrode) and the conductive elements 236 and 236' tied to the clock $\emptyset_L$ (and called the dynamic electrode). In an unaddressed line, charge will either be stored under the static electrode as shown by potential profile b if the clock $\emptyset_L$ is maintained low or under the dynamic electrode as shown by potential profile b if the clock $\emptyset_L$ is maintained high. In either case, one complete cycle of the clock $\emptyset_L$ will move the stored charge from one memory cell to the next.

The principles of this invention are also applicable to MOS shift registers. In particular, the CCD shift registers shown in FIG. 1 can be replaced by MOS shift registers.

We claim

1. A line-addressable random-access memory, comprising:
    a plurality of lines of charge storage elements;
    means for introducing charge representing binary information to the beginning of particular ones of said plurality of lines of charge storage elements which are addressed;
    at least one data clock signal means to effect the transfer of charge along those lines of said charge storage elements which are addressed;
    an address-selection matrix, including a plurality of line drivers corresponding on a one-to-one basis to said plurality of lines of charge storage elements, electrically coupled between said data clock signal means and said lines to permit the addressed ones of said lines to be clocked while the unaddressed lines are maintained in a definite state;
    charge sensor means for receiving charge from said addressed lines and, in response thereto, generating a signal which represents the data signified by said charge; and
    recirculation means for recirculating a refreshed representation of said charge from said charge sensor means to said means for introducing charge.

2. A line-addressable random-access memory as recited in claim 1 wherein each of said charge storage elements in said lines comprises a single transistor memory cell.

3. A line-addressable random-access memory as recited in claim 1 wherein said lines of charge storage elements comprise lines of charge-coupled elements.

4. A line-addressable random-access memory as recited in claim 3 wherein said lines of charge-coupled elements comprise uniphase charge-coupled lines.

5. A line-addressable random-access memory as recited in claim 4 wherein said lines of charge-coupled elements are fabricated in a p-type substrate.

6. A line-addressable random-access memory as recited in claim 5 wherein the dynamic electrode is held at a high potential in unaddressed lines.

7. A line-addressable random-access memory as recited in claim 4 wherein said plurality of lines of charge-coupled elements consist of four groups of lines with each group having 32 lines of charge-coupled elements and a reference line of charge-coupled elements.

8. A line-addressable random-access memory as recited in claim 1 wherein each of said plurality of lines of charge storage elements comprises and MOS shift register.

* * * * *